United States Patent
Kadoi

(10) Patent No.: US 11,251,110 B2
(45) Date of Patent: Feb. 15, 2022

(54) SEMICONDUCTOR DEVICE AND METHOD OF MANUFACTURING THE SEMICONDUCTOR DEVICE

(71) Applicant: ABLIC Inc., Chiba (JP)

(72) Inventor: Kiyoaki Kadoi, Chiba (JP)

(73) Assignee: ABLIC INC., Chiba (JP)

( * ) Notice: Subject to any disclaimer, the term of this patent is extended or adjusted under 35 U.S.C. 154(b) by 17 days.

(21) Appl. No.: 16/250,464

(22) Filed: Jan. 17, 2019

(65) Prior Publication Data
US 2019/0279921 A1    Sep. 12, 2019

(30) Foreign Application Priority Data
Mar. 8, 2018  (JP) .............................. JP2018-042271

(51) Int. Cl.
*H01L 23/495*  (2006.01)
*H01L 23/31*  (2006.01)
(Continued)

(52) U.S. Cl.
CPC .... *H01L 23/49503* (2013.01); *H01L 21/4828* (2013.01); *H01L 21/4842* (2013.01);
(Continued)

(58) Field of Classification Search
CPC ........... H01L 23/49503; H01L 23/4951; H01L 23/49548; H01L 23/3121–3128; H01L 33/54
See application file for complete search history.

(56) References Cited

U.S. PATENT DOCUMENTS 6,777,788 B1 *  8/2004  Wan ...................... H05K 3/341
                                                    174/528
2001/0044169 A1 * 11/2001  Yasunaga .............. H01L 21/561
                                                    438/112
(Continued)

FOREIGN PATENT DOCUMENTS

CN       103681577 A    3/2014
JP       2003-158235 A   5/2003
(Continued)

OTHER PUBLICATIONS

Cabading Jr., et al., "Systematic Approach in Testing the Viability of Mechanical Partial-cut Singulation Process towards Tin-Plateable Sidewalls for Wettable Flank on Automotive QFN Technology", 2016, IEEE, 18th Electronic Packaging Technology Conference (EPTC), pp. 254-258.
(Continued)

*Primary Examiner* — Lauren R Bell
(74) *Attorney, Agent, or Firm* — Crowell & Moring LLP

(57) ABSTRACT

In a semiconductor device (4), a semiconductor chip (10) is mounted on a die pad (6) which has a die pad overhang portion (6a) and leads (9) are arranged around and apart from the die pad (6). The leads (9) and the semiconductor chip (10) are electrically connected and are covered with a sealing resin (8). A concave portion (7e) is formed on the outer side of each lead (9), i.e., the far side from the die pad. A lead concave surface (7d) facing the concave portion (7e) includes a forward-tapered lead slope surface (7h). Side surface of the sealing resin (8) has a step of a staircase shape formed from the first and the second resin side surfaces (8a and 8b). A tip of the lead (9) protrudes past the first resin side surface (8a).

12 Claims, 6 Drawing Sheets

(51) Int. Cl.
*H01L 21/56* (2006.01)
*H01L 21/48* (2006.01)
*H01L 21/78* (2006.01)
*H01L 23/00* (2006.01)

(52) U.S. Cl.
CPC ............ *H01L 21/561* (2013.01); *H01L 21/78* (2013.01); *H01L 23/3121* (2013.01); *H01L 23/49548* (2013.01); *H01L 24/49* (2013.01)

(56) References Cited

U.S. PATENT DOCUMENTS

| | | | |
|---|---|---|---|
| 2003/0096456 A1 | 5/2003 | Yasunaga et al. | |
| 2005/0139982 A1* | 6/2005 | Fukaya | H01L 23/49548 |
| | | | 257/690 |
| 2014/0084435 A1 | 3/2014 | Kimura | |
| 2015/0147848 A1* | 5/2015 | Kimura | H01L 24/33 |
| | | | 438/112 |
| 2015/0262919 A1* | 9/2015 | Tran | H01L 21/78 |
| | | | 257/676 |
| 2016/0379916 A1* | 12/2016 | Talledo | H01L 24/97 |
| | | | 257/676 |

FOREIGN PATENT DOCUMENTS

| | | |
|---|---|---|
| JP | 2003-332269 A | 11/2003 |
| JP | 2008-218469 A | 9/2008 |
| JP | 2010-192509 A | 9/2010 |
| JP | 2011-216615 A | 10/2011 |
| JP | 2014-067750 A | 4/2014 |
| JP | 2017-152588 A | 8/2017 |

OTHER PUBLICATIONS

Office Action in Japan Application No. 2018-042271, including English translation, dated Oct. 26, 2021, 8 pages.
Search Report in Japan Application No. 2018-042271, dated Oct. 14, 2021, 9 pages.

* cited by examiner

SEMICONDUCTOR DEVICE AND METHOD OF MANUFACTURING THE SEMICONDUCTOR DEVICE

RELATED APPLICATIONS

This application claims priority under 35 U.S.C. § 119 to Japanese Patent Application No. 2018-042271 filed on Mar. 8, 2018, the entire content of which is hereby incorporated by reference.

BACKGROUND OF THE INVENTION

1. Field of the Invention

The present invention relates to a semiconductor device and a method of manufacturing the semiconductor device.

2. Description of the Related Art

A collective sealing block is formed by mounting a semiconductor chip on each of a plurality of die pads of lead frames and collectively sealing the lead frames and the plurality of semiconductor chips with a sealing resin. The plurality of semiconductor chips is arranged in a matrix pattern in the collective sealing block and is separated into individual small-sized semiconductor devices by cutting the collective sealing block along boundary lines by dicing.

In the collective sealing block, each lead is embedded in the sealing resin so as to extend between the adjacent semiconductor devices. When the collective sealing block is divided into individual pieces, the lead is cut at boundary portions and left as a lead in an individual semiconductor device to function as a lead for assembling the semiconductor device on a mounting board. The lead in this type of semiconductor device is cut along with the sealing resin, and a cut surface of the lead accordingly appear on a side surface of the cut sealing resin. Metal burr may be formed on the sealing resin in the cutting. The metal burr is made of a metal material from which the lead frames are constructed and may extend along the cut surface to cause a short circuit between the plurality of leads in some cases. The metal burr fallen off for some reason can also cause a short circuit between tracks of one of the semiconductor device and the mounting board when the semiconductor device is assembled to the mounting board. Technologies of preventing the formation of the metal burr are described in Japanese Patent Application Laid-open No. 2008-218469 and Japanese Patent Application Laid-open No. 2011-216615.

Another drawback of a semiconductor device that is an individual piece separated from other semiconductor devices by dicing is that the mounting strength of the semiconductor device relies on the lead's bottom surface and on the lead's side surfaces which are poor in solder wettability. A method of improving the solder wettability of a lead is described in "Systematic Approach in Testing the Viability of Mechanical Partial-cut Singulation Process towards Tin-plateable Sidewalls for Wettable Flank on Automotive QFN Technology", 2016, IEEE EPTC, pp. 254-258 (hereinafter referred to as Non-patent Document 1), which deals with a technology involving shaping a part of a lower surface of a lead that is placed along the perimeter of a semiconductor device into a concave shape, and then plating the lead. A surface of the lead along the perimeter of the semiconductor device is partially plated because of the concave shape, and hence not only the lead's bottom surface but also the lead's side surfaces can partially be connected by solder. The semiconductor device can thus have an improved mounting strength.

However, it is not easy to check the state of solder connection of a semiconductor device that is manufactured by a manufacturing method described in one of Japanese Patent Application Laid-open No. 2008-218469, Japanese Patent Application Laid-open No. 2011-216615, and Non-patent Document 1 and assembled on a mounting board. In addition, because the top surface of the lead of the semiconductor device is in contact with resin and cannot be connected via solder, the mounting strength of the semiconductor package inevitably depends only on the lead's bottom surface and the lead's side surfaces with poor solder wettability, and the mounting strength is limited as a result.

SUMMARY OF THE INVENTION

It is therefore an object of the present invention to provide a semiconductor device which has fine board mounting properties and in which it is easy to visually check the state of solder connection, and a method of manufacturing the semiconductor device.

To attain this object, the present invention employs structure and method of manufacturing described below.

There is provided a semiconductor device including: a die pad having a semiconductor chip mounted thereon; a plurality of leads arranged around the die pad; and a sealing resin exposing a lower surface of each of the plurality of leads and an outer side of the each of the plurality of leads, the outer side being a far side of the each of the plurality of leads from the die pad, the outer side of the each of the plurality of leads having an upper portion in which a concave portion is formed, the concave portion being faced with a lead concave surface including at least a forward-tapered slope surface, and the outer side of the each of the plurality of leads protruding past a part of a side surface of the sealing resin.

There is provided a method of manufacturing a semiconductor device, the method including: preparing a lead frame having a die pad and a plurality of leads arranged around the die pad; mounting a semiconductor chip on the die pad, and electrically connecting the semiconductor chip and the plurality of leads; forming a collective sealing block by sealing at least the die pad, the semiconductor chip, and the plurality of leads with resin; sticking a protective film to a bottom surface of the collective sealing block; first cutting midway in each of the plurality of leads from a top surface opposite to the bottom surface of the collective sealing block, with a dicing blade having a first width, to thereby form a first cut area; first etching isotropically a part of the each of the plurality of leads that is exposed in the first cut area; second cutting from a bottom surface of the first cut area through the bottom surface of the collective sealing block, with a dicing blade having a second width which is narrower than the first width to thereby form a lead; and removing the protective film.

A semiconductor device which easies visual check of the connection state of a terminal of the semiconductor device already assembled on a mounting board and which has fine board mounting properties as well, and a method of manufacturing the semiconductor device can be obtained by using the means described above.

DETAILED DESCRIPTION OF THE PREFERRED EMBODIMENTS

Figure 1:
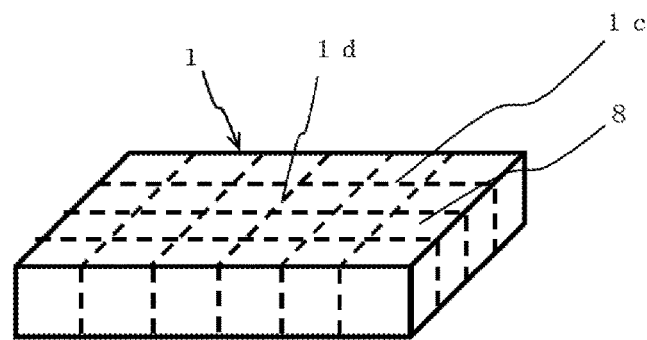
FIG. 1 is a perspective view for illustrating a method of manufacturing a semiconductor device according to a first embodiment of the present invention.

A description is now given of embodiments of the present invention referring to the drawings.

First Embodiment

FIG. 1 is a perspective view for illustrating a method of manufacturing a semiconductor device according to the first embodiment of the present invention. A collective sealing block 1 is a block of a sealing resin 8 in which semiconductor chips and others are sealed. Cutting lines 1c and 1d illustrated in FIG. 1 are in a grid pattern on the collective sealing block 1, and the collective sealing block 1 is divided into individual semiconductor devices along the cutting lines.

Figure 2:
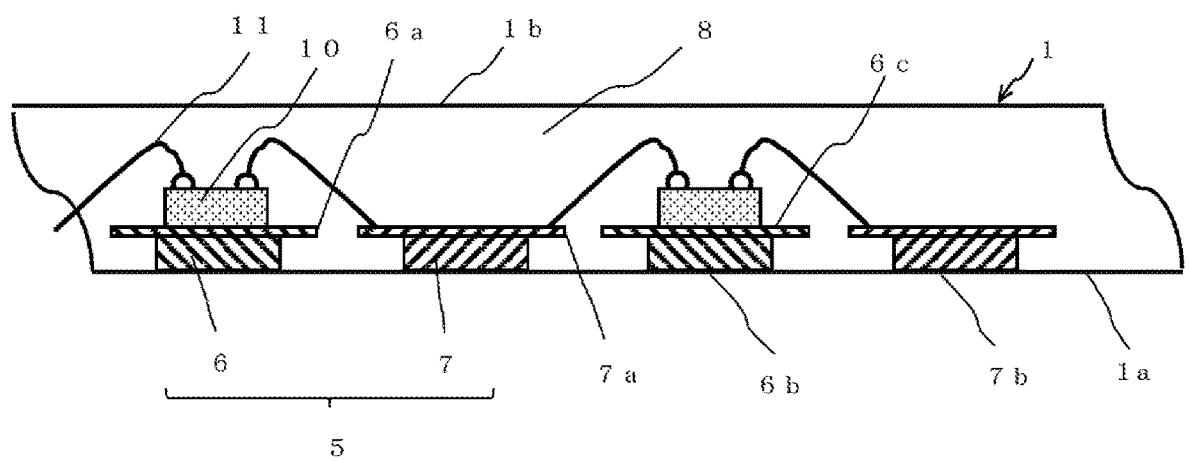
FIG. 2 is a sectional view for illustrating a step of the method of manufacturing the semiconductor device according to the first embodiment of the present invention.

FIG. 2 is a sectional view for illustrating a step of the method of manufacturing the semiconductor device according to the first embodiment of the present invention. The collective sealing block 1 is constructed by covering a lead frame 5, a semiconductor chip 10, and bonding wires 11 with the sealing resin 8. The lead frame 5 includes a die pad 6 and lead forming portions 7. The semiconductor chip 10 is each mounted on a die pad top surface 6c of the die pad 6. The bonding wires 11 each electrically connect an electrode on the semiconductor chip 10 to one of lead forming portions 7. A die pad bottom surface 6b of a thick portion of each die pad 6 and a lead bottom surface 7b of a thick portion of each of the lead forming portions 7 are exposed on a resin bottom surface 1a of the collective sealing block 1. Further, a thin portion is provided around the top surface of each die pad 6 to form a die pad overhang portion 6a, and a thin portion is provided around the top surface of each lead forming portion 7 to form a lead overhang portion 7a.

To form the collective sealing block 1, the lead frame 5 which include the die pad 6 and the plurality of lead forming portions 7 arranged around each of the die pad 6 are prepared first. The semiconductor chip 10 is each mounted on the die pad 6 next. After the semiconductor chips 10 and the lead forming portions 7 are electrically connected via the bonding wires 11, the die pad 6, the semiconductor chip 10, the lead forming portions 7, and the bonding wires 11 are sealed with resin. The collective sealing block is formed through this process.

Figure 3:
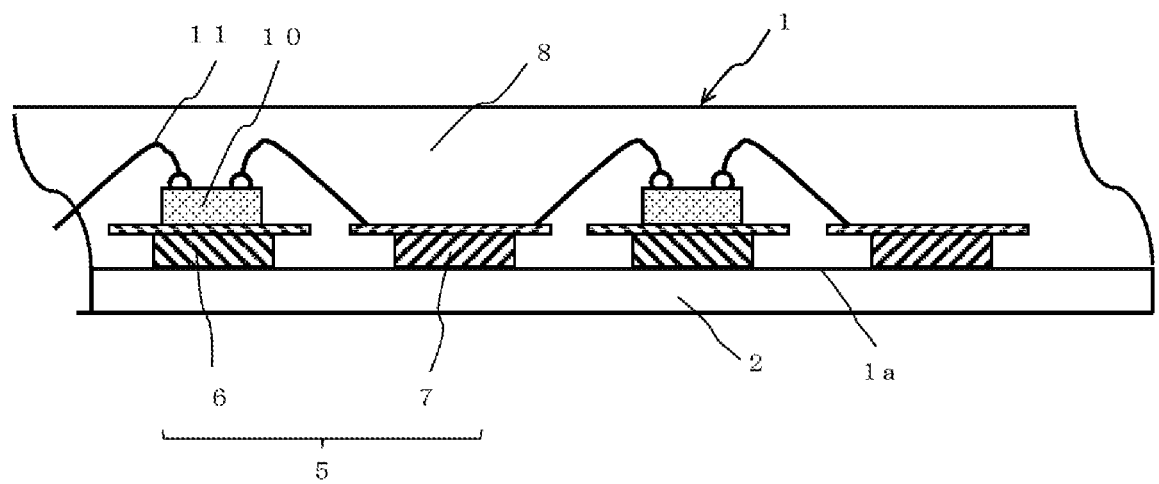
FIG. 3 is a sectional view for illustrating a step that follows the step of FIG. 2 in the method of manufacturing the semiconductor device according to the first embodiment of the present invention.

FIG. 3 is a sectional view for illustrating a step that follows the step of FIG. 2 in the method of manufacturing the semiconductor device according to the first embodiment of the present invention, and a state in which a protective film 2 is stuck to the resin bottom surface 1a is illustrated in FIG. 3. The protective film 2 is made of an organic material or the like having etching resistance, and may be formed into a sheet shape in advance as in the case of a dicing tape, and is stuck to the bottom surface of the collective sealing block 1, or may be formed by applying an etching-resistant organic material to the bottom surface of the collective sealing block 1 and then cured to harden.

Figure 4:
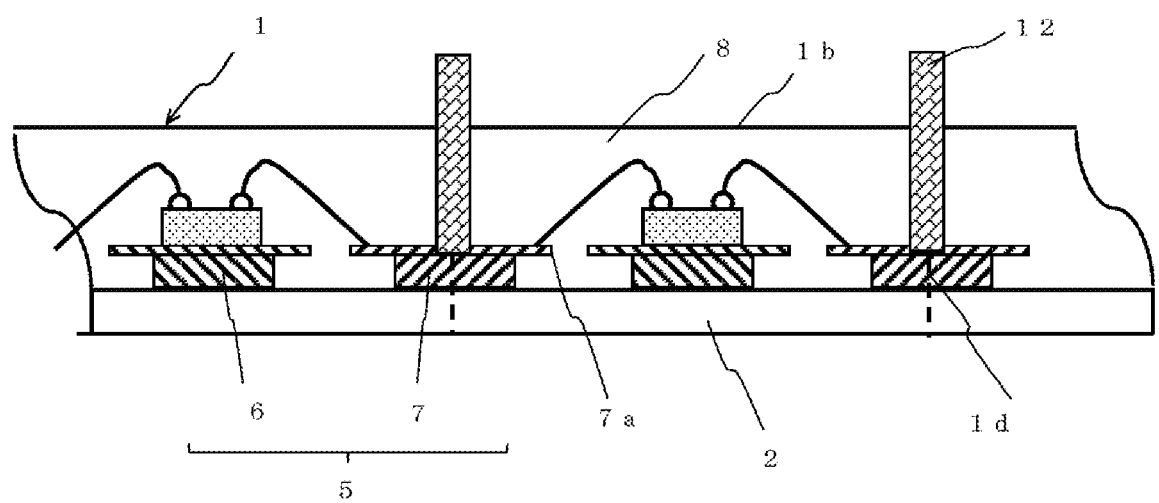
FIG. 4 is a sectional view for illustrating a step that follows the step of FIG. 3 in the method of manufacturing the semiconductor device according to the first embodiment of the present invention.

Next, as illustrated in FIG. 4, a part of the collective sealing block 1 is cut by using a wide first dicing blade 12 along the cutting line 1d from a resin top surface 1b side. Each cutting line 1d runs along the center of each lead forming portion 7 to divide the lead forming portions 7 into left and right portions equal in quantity. The first dicing blade 12 starts the first cutting from the resin top surface along the cutting line 1d, and after the first cutting to some depth or midway in the lead forming portion 7, for example, at a depth equivalent to the bottom of a thin portion of the lead forming portion 7, the first dicing blade 12 is pulled out of the collective sealing block 1. The dicing blade used here is preferred to have a thickness of, desirably, 100 µm or more. The first cutting is performed along each of the cutting lines 1c which are lateral lines illustrated in FIG. 1, and each of the cutting lines 1d which are longitudinal lines in FIG. 1.

Figure 5:
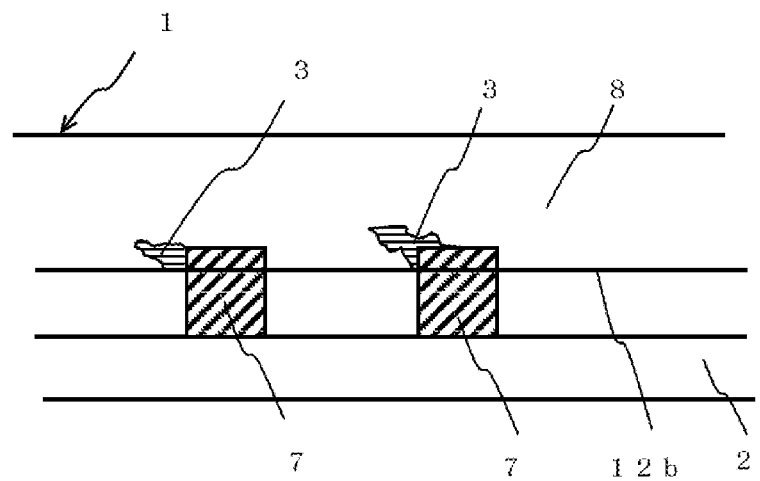
FIG. 5 is a diagram for illustrating metal burrs formed on cut surfaces of lead frames by first cutting.

FIG. 5 is a sectional view of a plurality of lead forming portions 7 aligned in the depth direction to the plane of the sheet of FIG. 4. A first cut lower surface 12b is the lower surface of an area cut and removed by the first dicing blade. When the first dicing blade cuts both the sealing resin 8 and the lead forming portions 7, an extensible metal on surfaces of the lead forming portions 7 (here, copper (Cu)) is cut and drawn by the rotating dicing blade, and a metal burr 3 is consequently formed on the sealing resin in some cases. Since the metal burr 3 that is formed long enough to extend across the space between adjacent lead forming portions 7 causes defective in characteristics, removal of the metal burr 3 is required.

Figure 6:
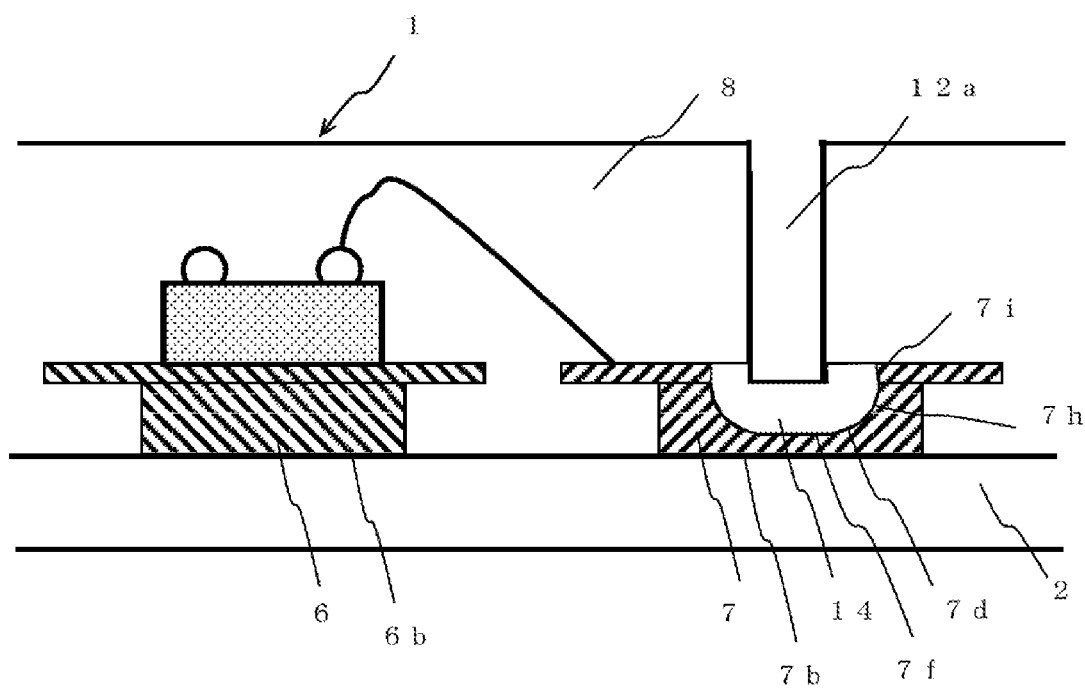
FIG. 6 is a sectional view for illustrating a step that follows the step of FIG. 4 in the method of manufacturing the semiconductor device according to the first embodiment of the present invention.

FIG. 6 is a sectional view for illustrating a step that follows the step of FIG. 4 in the method of manufacturing the semiconductor device according to the first embodiment of the present invention and shows an etching step. Wet isotropic etching is used to remove the metal burr 3 formed by the first cutting. A sulfuric acid/hydrogen peroxide solution or ferric chloride solution is used as an etchant capable of selectively etching copper without etching the sealing resin 8. When the collective sealing block 1 is immersed in the etchant, the etchant seeps into a first cut area 12a formed by the first cutting and starts isotropically etching the lead forming portion 7 that appears on the bottom and side surfaces of the first cut area 12a. The etching terminates while leaving a part of the lead forming portion 7 in its depth direction. Half etching is performed on the lead forming portion 7 in this manner in order to prevent fluctuations in the length of leads which are formed later. The etching forms an etched area 14 between the first cut area 12a and a lead concave surface 7d which is a surface of the lead forming portion 7. The lead concave surface 7d is made of a forward-tapered slope surface and flat surfaces connecting to the slope surface. The flat surfaces are a lead horizontal surface 7f and a lead vertical surface 7i which reflect the shapes of the bottom and side surfaces of the first cut area 12a, respectively. The forward-tapered lead slope surface 7h has a shape of curved concave surface. The part of the lead forming portion 7 remaining after the etching desirably has a thickness from about ⅓ to about ¹⁄₁₀ of the total thickness. In the first embodiment, the die pad bottom surface 6b and the lead bottom surface 7b which are covered with the protective film 2 are not hollowed in the etching and maintain the flatness.

Figure 7:
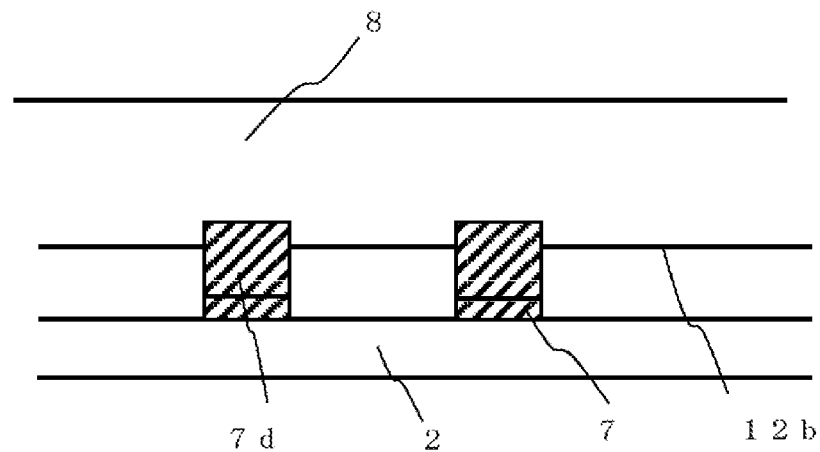
FIG. 7 is a sectional view for illustrating a state in which the metal burrs are removed by etching.

FIG. 7 is a sectional view of a plurality of lead forming portions 7 aligned in the depth direction to the plane of the sheet of FIG. 6. Each metal burr 3 illustrated in FIG. 5 is thin and is accordingly removed during the etching of the lead forming portions 7. The upper portion of each lead forming portion 7 illustrated in FIG. 7 is the lead concave surface 7d formed by etching, and the lower portion of the lead forming portion 7 is the part left uncut and continuous after the etching.

Figure 8:
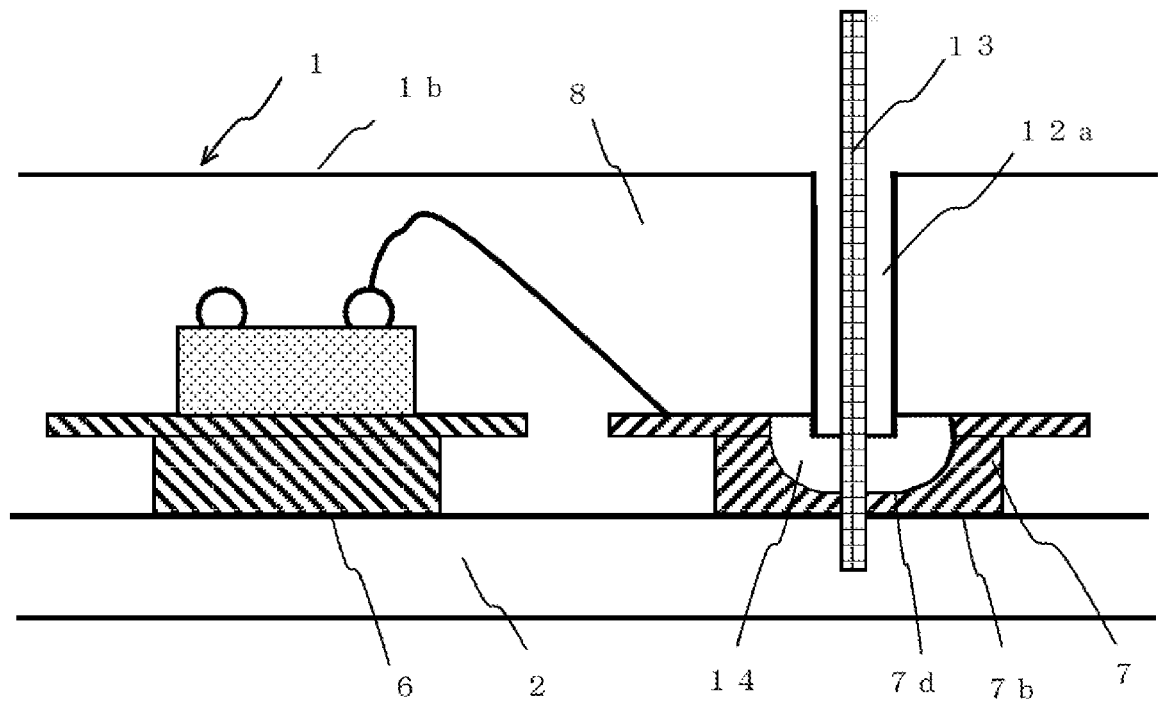
FIG. 8 is a sectional view for illustrating a step that follows the step of FIG. 6 in the method of manufacturing the semiconductor device according to the first embodiment of the present invention.
Figure 9:
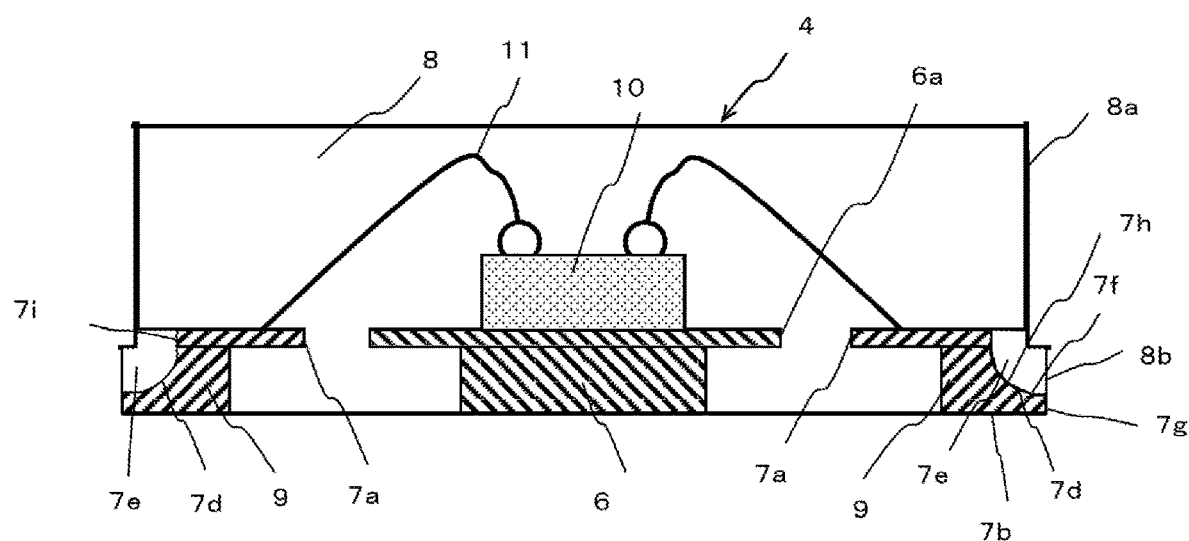
FIG. 9 is a sectional view of the semiconductor device according to the first embodiment of the present invention.

FIG. 8 is a sectional view for illustrating a step that follows the step of FIG. 6 in the method of manufacturing the semiconductor device according to the first embodiment of the present invention. The step illustrated in FIG. 8 involves the second cutting of the collective sealing block 1 completely with the use of a second dicing blade 13 to break the collective sealing block 1 into individual semiconductor devices 4. The second dicing blade 13 used here is a narrower blade, whose thickness is between 30 μm and 80 μm, compared to the first dicing blade 12. The second dicing blade 12 enters the collective sealing block 1 from the resin top surface 1b side, starts the second cutting from the vicinity of the central portion of the first cut area 12a, and cuts the sealing resin 8 and the remaining part of the lead forming portion 7 so as to divide the remaining part equally into left and right portions, thereby forming leads 9, which is illustrated in FIG. 9. The tip of the second dicing blade 13 at this point reaches a point midway through the protective film 2 stuck to the lead bottom surface 7b. The second cutting is performed along each of the cutting lines 1c, which are lateral lines illustrated in FIG. 1, and each of the cutting lines 1d, which are longitudinal lines in FIG. 1. When the second metal burr (not shown) is formed by the second cutting, light second etching may be conducted to remove the second metal burr. The second etching may be unnecessary when the lower portion of the lead forming portion 7 which is cut completely is thin and only few second metal burrs are formed. A sulfuric acid/hydrogen peroxide solution or ferric chloride solution is used as an etchant here to selectively etch copper without etching the sealing resin 8.

The protective film 2 is then removed and electrolytic plating is performed to form a plating film of a Ni/Pd/Au laminated film on the lead concave surface 7d and the lead bottom surface 7b. The board mounting properties of the leads 9 are improved by forming the plating film. However, the effects of the present invention can be obtained without the plating. The protective film 2 may be removed by peeling the protective film 2 off the collective sealing block 1, or by dissolving the protective film 2 in a solvent.

A semiconductor device according to the present invention is obtained through the processes described above.

FIG. 9 is a sectional view of the semiconductor device according to the first embodiment of the present invention. In the semiconductor device 4, the semiconductor chip 10 is mounted on the die pad 6, which has the die pad overhang portion 6a as a thin portion on the top thereof, the leads 9 are provided around and apart from the die pad 6 and are electrically connected to the semiconductor chip 10 by the bonding wires 11, and the sealing resin 8 covers the semiconductor chip 10, the bonding wires 11, the die pad 6, and the leads 9. A concave portion 7e is formed on the outer side of each lead 9 which is the far side from the die pad. The lead concave surface 7d facing the concave portion 7e is made of the lead vertical surface 7i, the forward-tapered lead slope surface 7h, and the lead horizontal surface 7f contiguous to the lead slope surface 7h. The lead horizontal surface 7f is formed in parallel to the lead bottom surface 7b. A lead cut surface 7g located at the outermost end of the lead 9 locates from the lead horizontal surface 7f to the lead bottom surface 7b. The side surface of the sealing resin 8 has a step which forms a staircase shape. The side surface of the sealing resin 8 is made of a first resin side surface 8a which is an upper portion and a second resin side surface 8b which is a lower portion and is on the same plane as the lead cut surface 7g. A tip that is a part of the lead 9 protrudes past the first resin side surface 8a.

Figure 10:
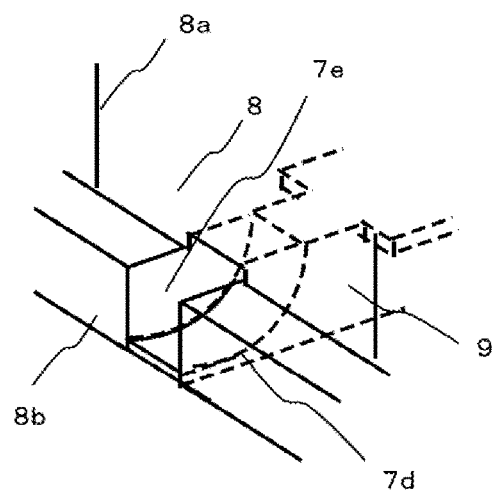
FIG. 10 is a perspective view of a lead portion of the semiconductor device according to the first embodiment of the present invention.

FIG. 10 is a perspective view of a lead portion of the semiconductor device according to the first embodiment of the present invention. The sealing resin 8 has a step of a staircase shape formed from the first resin side surface 8a and the second resin side surface 8b. The lead concave portion 7e formed on the outer side of the lead 9 is surrounded on both sides by the sealing resin 8 and is formed to have an undercut of the sealing resin 8.

Figure 11:
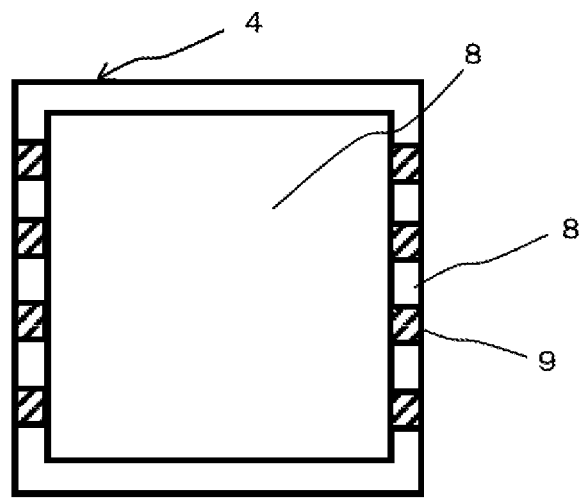
FIG. 11 is a top view of the semiconductor device according to the first embodiment of the present invention.

FIG. 11 is a top view of the semiconductor device according to the first embodiment of the present invention. Since the leads 9 are made visible between portions of the sealing resin 8, checking solder wettability in an appearance inspection becomes easy after assembling the semiconductor device 4 on the mounting board.

The plating step, which is placed after the removal of the protective film 2 in the description given above, may be conducted after the etching step of FIG. 6. In that case, however, plating covers only the lead concave surface 7d, and not the lead bottom surface 7b. Plating the lead bottom surface 7b can be made in an additional step conducted before the step of sticking the protective film 2 or after the step of removing the protective film 2.

According to the first embodiment described above, the metal burr 3 formed on a cut surface by the first cutting with the first dicing blade 12 can be removed by etching, thereby preventing a short circuit between a plurality of leads. A short circuit between conductors of the semiconductor device 4 or the mounting board can also be prevented when the semiconductor device 4 separated as an individual piece from other semiconductor devices is assembled on the mounting board. Another advantage is that the leads formed by etching have a forward-tapered shape and accordingly help solder to creep onto the lead concave surface 7d in assembling the mounting board, thereby permitting a solid connection strength. The state of solder connection can be observed from above the semiconductor device 4 as well to carry out a quality check. The solder that has crept onto the lead is also surrounded by the sealing resin 8 on the lead's side surfaces, and hence the risk of short circuit between adjacent leads is reduced. In addition, the semiconductor device 4 can have a high dimensional precision because the dimensions of the sealing resin 8 and the leads 9 depend on the second cutting with the second dicing blade 13.

Second Embodiment

Figure 12:
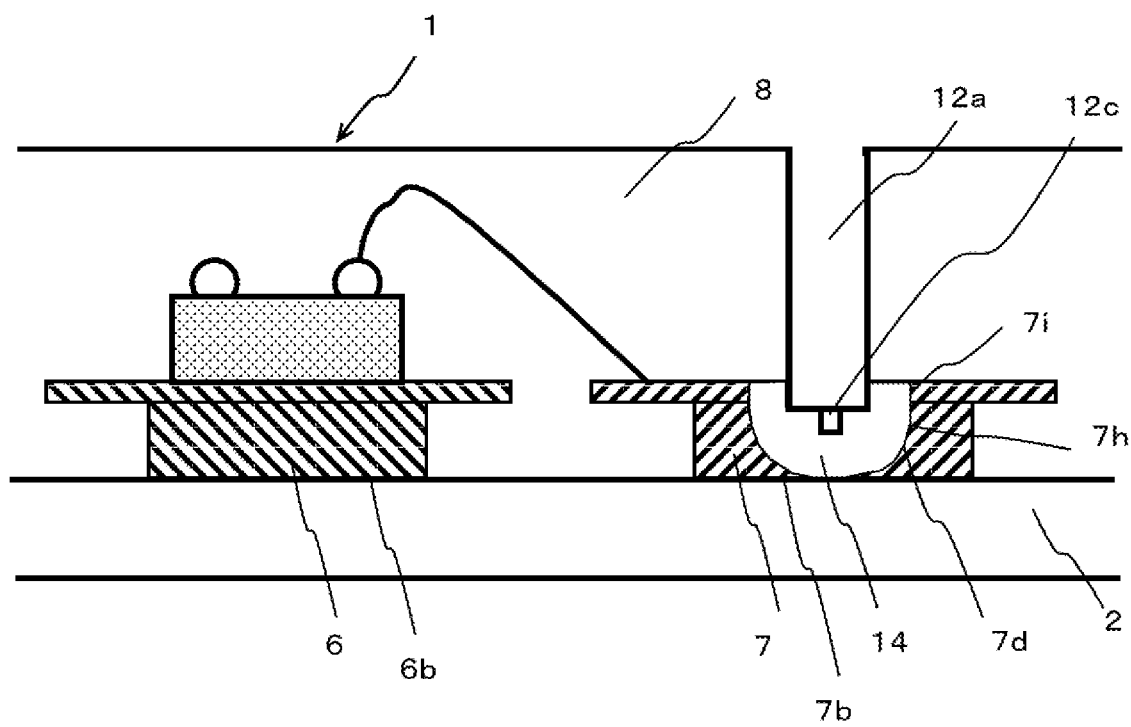
FIG. 12 is a sectional view for illustrating a step of a method of manufacturing a semiconductor device according to a second embodiment of the present invention.

FIG. 12 is a sectional view of a method of manufacturing a semiconductor device according to a second embodiment of the present invention. By comparison differences from FIG. 6 of the first embodiment reside in that a thin and deep third cut area 12c is formed at the distal end of the first cut area 12a and in that a part of the etching area 14 that corresponds to the third cut area 12c reaches the lead bottom surface 7b. To form the first cut area 12a and the third cut area 12c, the first cut area 12a is formed first by using a wide first dicing blade whose thickness is 100 μm or more to cut to the vicinity of the bottom surface of the thin portion of the lead forming portion 7, and the third cut area 12c is formed next by digging down the central portion of the first cut area 12a with a third dicing blade whose thickness is between 20 μm and 30 μm), which is narrower than the second dicing blade used in the first embodiment. The third cutting may be conducted simultaneously in a single step by using a dicing blade that is created by providing the very thin third dicing blade whose thickness is between 20 μm and 30 μm at the tip of the wide first dicing blade whose thickness is 100 μm or more.

A lead cut surface, which is denoted by 7g in FIG. 9, formed at an outer end of the lead by the above manufacturing method is minimal, and hence helps solder to creep onto the lead better and improves solder wettability even more in the board assembling. Since the amount of the lower portion of the lead forming portion 7 which is cut in the complete third cutting with the second dicing blade is minimal as well, the second etching for the second metal burr generated in the complete third cutting becomes unnecessary.

Manufacturing steps according to the second embodiment other than those described above conform to the manufacturing steps according to the first embodiment. The semiconductor device obtained from the second embodiment has the semiconductor device structure obtained from the first embodiment to which the differences described above are added.

According to the second embodiment described above, the metal burr 3 formed on a cut surface by the first cutting with the first dicing blade 12 can be removed by etching, thereby preventing a short circuit between a plurality of leads. A short circuit between conductors of the semiconductor device 4 or the mounting board can also be prevented when the semiconductor device 4 separated as an individual piece from other semiconductor devices is assembled on the mounting board. Another advantage is that the leads 9 formed by etching have a forward-tapered shape and accordingly help solder to creep onto the lead concave surface 7d in assembling the mounting board, thereby permitting a solid connection strength. In the second embodiment, the cut surface at the tip of each lead 9 is minimal, and hence helps solder to creep upon the lead even better and provides accordingly solid connection. The state of solder connection can be observed from above the semiconductor device 4 as well. The solder that has crept onto the lead is also surrounded by the sealing resin on the lead's side surfaces, and hence the risk of short circuit between adjacent leads is reduced. In addition, the semiconductor device 4 can have a high dimensional precision because the dimensions of the sealing resin 8 and the leads 9 depend on the second cutting with the second dicing blade 13.

What is claimed is:

1. A semiconductor device, comprising:
a die pad having a semiconductor chip mounted thereon;
a plurality of leads around the die pad; and
a sealing resin exposing a lower surface of each lead of the plurality of leads and exposing an outer side of each lead of the plurality of leads, where the outer side of each lead of the plurality of leads is opposite to the die pad, wherein the sealing resin has a staircase side profile including a first vertical resin side surface and a second vertical resin side surface below the first vertical resin side surface and a horizontal surface connecting the first vertical reside surface and the second vertical resin surface, wherein the second vertical resin side surface is further from the die pad than the first vertical resin surface;
the outer side of each lead of the plurality of leads having an upper portion including a concave portion,
the concave portion being faced with a lead concave surface including at least a forward-tapered slope surface,
the outer side of each lead of the plurality of leads protruding past the first vertical resin side surface when viewed from above the semiconductor device and extending to the second vertical resin side surface when viewed from above the semiconductor device, and
wherein at least an outer portion of the lead concave surface is exposed when viewed from above the semiconductor device such that the horizontal surface of the staircase side profile is absent directly above the at least the outer portion of the lead concave surface.

2. The semiconductor device according to claim 1, wherein the lead concave surface further includes a horizontal surface.

3. The semiconductor device according to claim 2, wherein at least an outer portion of the horizontal surface of the lead concave surface extends past the first vertical side resin surface.

4. The semiconductor device according to claim 1, wherein the horizontal surface of the staircase side profile is in a plane that is lower than a plane of a top surface of the plurality of leads.

5. The semiconductor device according to claim 1, wherein an inner portion of the lead concave surface that does not extend past the first vertical side resin surface is covered by the sealing resin when viewed from above.

6. The semiconductor device according to claim 1, wherein an inner portion of the lead concave surface is closer to the die pad than the first vertical side resin surface.

7. The semiconductor device according to claim 1, wherein the lead concave surface further includes a vertical surface.

8. The semiconductor device according to claim 7, wherein the vertical surface of the lead concave surface is closer to the die pad than the first vertical side resin surface.

9. The semiconductor device according to claim 1, further comprising an opening in the horizontal surface of the staircase side profile directly above the at least the outer portion of the lead concave surface.

10. The semiconductor device according to claim 9, wherein the opening in the horizontal surface of the staircase side profile directly above the at least the outer portion of the lead concave surface exposes the at least the outer portion of the lead concave surface when viewed from above the semiconductor device.

11. The semiconductor device according to claim 1, further comprising an opening in the first vertical side resin surface exposing the lead concave surface when viewed from a side of the semiconductor device.

12. The semiconductor device according to claim 11, wherein the opening in the first vertical side resin surface extends into the second vertical side resin surface to expose the lead concave surface when viewed from the side of the semiconductor device.

* * * * *